United States Patent
Ban et al.

(10) Patent No.: US 6,284,576 B1
(45) Date of Patent: Sep. 4, 2001

(54) MANUFACTURING METHOD OF A THIN-FILM TRANSISTOR OF A REVERSE STAGGERED TYPE

(75) Inventors: Atsushi Ban, Soraku-gun; Hisataka Suzuki, Taki-gun; Masaya Okamoto, Soraku-gun, all of (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/196,229

(22) Filed: Nov. 20, 1998

Related U.S. Application Data

(63) Continuation-in-part of application No. 08/887,136, filed on Jul. 2, 1997, now Pat. No. 5,953,583.

(30) Foreign Application Priority Data

Jul. 4, 1996 (JP) .................................................. 8-175266

(51) Int. Cl.$^7$ .................................................. H01L 21/00
(52) U.S. Cl. .................................................. 438/149; 257/66
(58) Field of Search .................................. 438/149, 151, 438/158, 159; 257/291, 66

(56) References Cited

U.S. PATENT DOCUMENTS

| | | |
|---|---|---|
| 4,680,086 | 7/1987 | Thomas et al. . |
| 5,017,984 | 5/1991 | Tanaka et al. . |
| 5,036,370 | 7/1991 | Miyago et al. . |
| 5,053,354 * | 10/1991 | Tanaka et al. .................. 438/159 |
| 5,109,260 | 4/1992 | Tanaka et al. . |
| 5,352,907 | 10/1994 | Matsuda et al. . |
| 5,475,246 * | 12/1995 | Wei et al. ............................. 257/291 |
| 5,723,371 * | 3/1998 | Seo et al. ............................. 438/158 |
| 5,783,494 * | 7/1998 | Sakurai et al. ...................... 438/719 |
| 5,872,370 * | 2/1999 | Gu et al. ............................. 257/66 |

FOREIGN PATENT DOCUMENTS

| | | |
|---|---|---|
| 1245226A | 9/1989 | (JP) . |
| 2073640A | 3/1990 | (JP) . |
| 7-28089A | 1/1995 | (JP) . |
| 7078995 | 3/1995 | (JP) . |
| 7142737 | 6/1995 | (JP) . |
| 7221312 | 8/1995 | (JP) . |

* cited by examiner

Primary Examiner—Long Pham
Assistant Examiner—William David Coleman

(57) ABSTRACT

A thin-film transistor of the reversed stagger type is provided with a gate electrode, first and second gate insulating films, a semiconductor layer, separated contact layers, and source electrodes and drain electrodes, all of which are stacked on a substrate. Upon manufacturing the thin-film transistor of this type, a gap section is pattered in a single contact-material layer. In this case, the contact-material layer is patterned by a dry etching with etching gases including $HCl+SF_6$ or $CF_4+O_2+HCl$ by the use of the source electrode and drain electrode as direct masks. Upon patterning a gap section in the contact-material layer between the source electrode and the drain electrode, no dedicated resist pattern is required; therefore, it is possible to reduce the number of the processes as compared with conventional manufacturing methods. Consequently, it becomes possible to reduce the production cost of thin-film transistors and also to improve the yield of desired products.

4 Claims, 5 Drawing Sheets

MANUFACTURING METHOD OF A THIN-FILM TRANSISTOR OF A REVERSE STAGGERED TYPE

This application is a continuation-in-part application of U.S. application Ser. No. 08/887,136 filed on Jul. 2, 1997, now U.S. Pat. No. 5,953,583.

FIELD OF THE INVENTION

The present invention relates to a manufacturing method of a thin-film transistor of the field-effect type that is commonly used as a switching element for pixel electrodes of liquid crystal displays and other elements.

BACKGROUND OF THE INVENTION

FIG. 4 is a plan view showing commonly used pixels on a TFT substrate for use in liquid crystal displays that is manufactured by using thin-film transistors of the field-effect type.

Signal lines 21 and gate lines 22 are installed on an insulating substrate so as to orthogonally intersect each other, and a thin-film transistor 20 having a source electrode 20a, a drain electrode 20b and a gate electrode 20c is placed in the vicinity of each of the intersections of the signal lines 21 and the gate lines 22. The source electrode 20a is connected to the corresponding signal line 21, the gate electrode 20c is connected to the corresponding gate line 22, and the drain electrode 20b is connected to the corresponding pixel electrode 23. Here, in FIG. 4, the reference numeral 24 represents a pixel storage capacitance.

The thin-film transistor 20 is a thin-film transistor of the so-called reversed stagger type wherein the gate electrode is placed right above the insulating substrate. Referring to FIGS. 5(a) and 5(b), an explanation will be given of a manufacturing method of a conventional thin-film transistor of the reversed stagger type. Here, FIG. 5(a) is a plan view of a thin-film transistor of the reversed stagger type that was manufactured in a conventional method, and FIG. 5(b) is a cross-sectional view taken along line B–B' of FIG. 5(a).

First, a gate-electrode material layer is formed on an electrically insulating substrate 32, and the gate-electrode material layer is patterned into a predetermined shape by a photolithography technique consisting of coating of photoresist, a patterning process of the resist (consisting of an exposing process and a rinsing process), an etching process, a removing process of the resist, etc.; thus, gate electrodes 33 are formed. Next, the surfaces of the gate electrodes 33 are subjected to anodic oxidation so that a gate insulating film 34 is formed, and then a gate insulating film 35 is formed in a manner so as to cover the gate electrodes 33. Additionally, the gate insulating films 34 and 35 are omitted from FIG. 5(a).

Next, a semiconductor-material layer that subsequently serves as a semiconductor layer 36 and a contact-material layer 37 that subsequently serves as contact layers 37a and 37b are formed in this order, and the semiconductor-material layer and the contact-material layer 37 are patterned at the same time by the photolithography technique. In this case, since only the semiconductor layer 36 is first patterned, the pattern of a gap section 40 between the source electrode 38 and the drain electrode 39 has not yet been formed. Successively, the pattern of the gap section 40 is formed in the contact-material layer 37 by the photolithography technique so that the contact layers 37a and 37b are formed (in FIG. 5(a), the contact layers 37a and 37b are indicated by cross-hatched regions). Here, there is a generally known manufacturing process in which at this time, an etching stopper layer is provided in the region of the gap section 40 between the semiconductor-material layer and the contact-material layer 37.

Thereafter, an electrode material that subsequently serves as a source electrode 38 and a drain electrode 39 is formed, and this electrode material is patterned by the photolithography technique so that source electrode 38 and the train electrode 39 are formed. The thin-film transistor of the reversed stagger type is manufactured by the processes as described above.

In this manner, the above-mentioned manufacturing method inevitably needs to use a specific resist pattern in order to form the gap section 40 during a patterning process of the gap section 40. This is also required in other conventional manufacturing methods similar to the above-mentioned manufacturing method.

In the current manufacturing processes of thin-film transistors, reduction of the number of processes has been a major problem to be solved in order to reduce the production costs and to improve the yield of desired products. However, in the above-mentioned conventional manufacturing methods, the production of the resist pattern used for the formation of the gap section further requires photolithography processes such as coating of resist and patterning of the resist (an exposing process and a rinsing process), resulting in a further problem of numerous processes.

SUMMARY OF THE INVENTION

The objective of the present invention is to provide a manufacturing method of a thin-film transistor that can reduce the production costs and improve the yield of desired products by reducing the number of processes.

In order to achieve the above-mentioned objective, a manufacturing method of thin-film transistors of the present invention has the following steps: a first step of forming a gate electrode on an electrically insulating substrate; a second step of forming a gate insulating film and a semiconductor layer on the gate electrode; a third step of forming a single contact-material layer on the semiconductor layer; a fourth step of forming an electrode-material layer by forming a conductive electrode material on the contact-material layer, as well as forming a source electrode and a drain electrode by patterning the electrode-material layer; and a fifth step of patterning a gap section that divides the contact-material layer into the source-electrode side and the drain-electrode side by a dry etching with etching gases including HCl and $SF_6$ using the source electrode and the drain electrode as masks so that a plurality of conductive contact layers are formed, in order to obtain a construction wherein the source electrode is connected to one side of the contact layer and the drain electrode is connected to the other side of the contact layer.

In the above-mentioned manufacturing method, the gap section is patterned in the contact-material layer by carrying out the etching process using the preliminarily formed source electrode and drain electrode as masks and patterning the gap section by a dry etching with etching gases including HCl and $SF_6$; therefore, the etching process can be carried out with a greater selectivity. Consequently, it is not necessary to make a resist pattern in order to etch the gap section. Consequently, since the photolithography process is eliminated, it is possible to reduce the production costs. Moreover, since the elimination of the photolithography process reduces the formation of unwanted patterns, thereby making it possible to improve the yield of desired products.

Furthermore, it is possible to suppress film wear of the electrodes serving as the masks, and also to reduce an increase in resistance and generation of new products.

In order to achieve the above-mentioned objective, another manufacturing method of thin-film transistors of the present invention has the following steps: a first step of forming a gate electrode on an electrically insulating substrate; a second step of forming a gate insulating film and a semiconductor layer on the gate electrode; a third step of forming a single contact-material layer on the semiconductor layer; a fourth step of forming an electrode-material layer by forming a conductive electrode material on the contact-material layer, as well as forming a source electrode and a drain electrode by patterning the electrode-material layer; and a fifth step of patterning a gap section that divides the contact-material layer into the source-electrode side and the drain-electrode side by a dry etching with etching gases including HCl and $CF_4$ using the source electrode and the drain electrode as masks or using the photoresist pattern that has been used for patterning the source electrode and the drain electrode so that a plurality of conductive contact layers are formed, in order to obtain a construction wherein the source electrode is connected to one side of the contact layer and the drain electrode is connected to the other side of the contact layer.

In the above-mentioned manufacturing method, since the gap section is patterned by a dry etching with etching gases including HCl and $CF_4$, it becomes possible to provide a sufficient selectivity between the contact-material layer and the semiconductor layer, and consequently to make the film thickness of the semiconductor layer thinner even in the case of the channel-etching type TFT. As a result, TFTs having superior characteristics such as the capability of suppressing light leak can be obtained. Moreover, it is possible to reduce generation of carbon dioxide. For example, as compared with $SF_6$, the greenhouse gas coefficient (relative coefficient on the assumption that $CO_2$ is 1) can be reduced to ¼, which is effective in terms of environmental protection.

Moreover, upon patterning the gap section in the contact-material layer, the etching is carried out by using the photoresist pattern, as it is, that has been used for patterning the source electrode and the drain electrode; this makes it possible to eliminate the necessity for manufacturing the resist pattern which is used upon etching the gap section in the same manner as the aforementioned manufacturing method, and consequently to reduce the production cost and improve the rate of nondefective products.

Furthermore, in this method, the source electrode and the drain electrode are not used for the masks directly; therefore, as compared with the aforementioned manufacturing method, this method is more advantageous in that, upon carrying out an etching process for the gap section, the etching conditions and the scope of selectivity of electrode materials for the source electrode and the drain electrode can be widened.

For a fuller understanding of the nature and advantages of the invention, reference should be made to the ensuing detailed description taken in conjunction with the accompanying drawings

BRIEF DESCRIPTION OF THE DRAWINGS

FIG. 1(*b*) is a cross-sectional view taken along line A–A' of FIG. 1(*a*).

FIG. 5(*b*) is a cross-sectional view taken along line B–B' of FIG. 5(*a*).

DESCRIPTION OF THE EMBODIMENTS
[EMBODIMENT 1]

Figure 1:
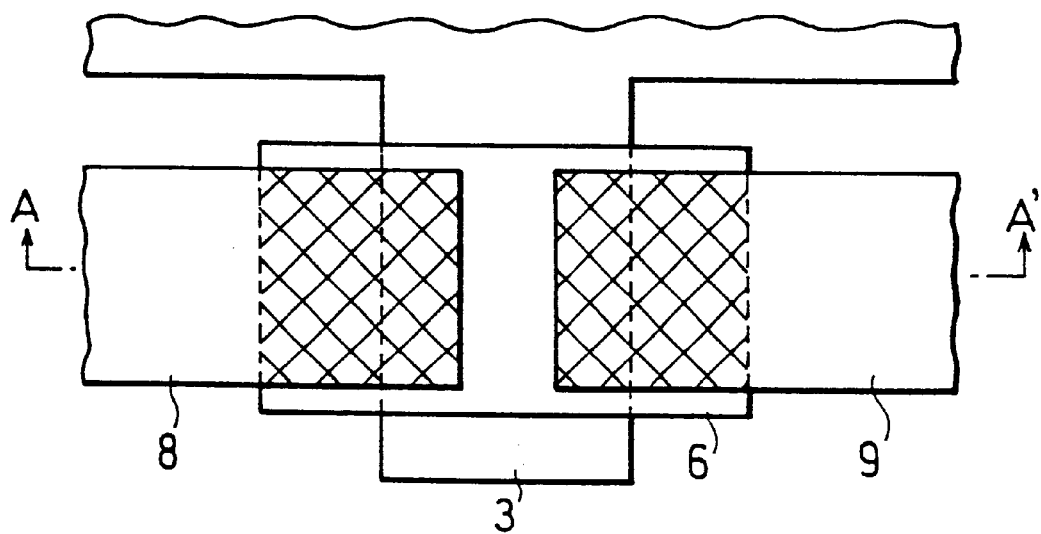
FIG. 1(*a*) is a plan view showing a construction of a thin-film transistor that is commonly applied to embodiments 1, 2 and 3 of the present invention.
Figure 1B:
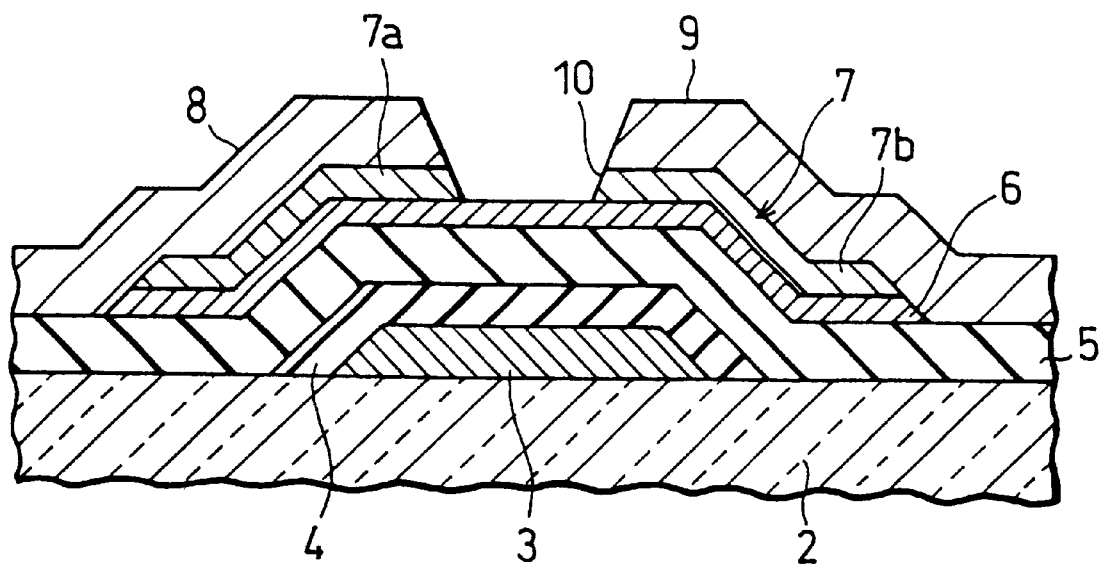
Figure 2:
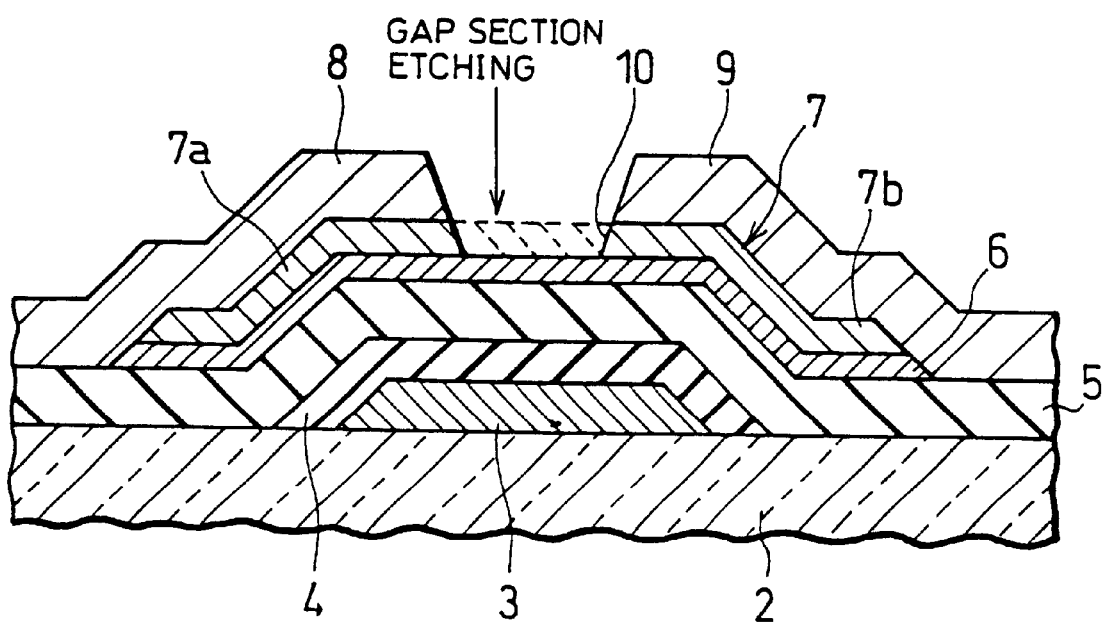
FIG. 2 is a cross-sectional view of the thin-film transistor that clearly shows a processed portion thereof in order to explain manufacturing processes of the thin-film transistor in Embodiment 1 of the present invention.

Referring to FIGS. 1 and 2 the following description will discuss one embodiment of the present invention.

First, referring to FIGS. 1(*a*) and 1(*b*), an explanation will be given of a construction of a thin-film transistor of the present embodiment. FIG. 1(*a*) is a plan view of the thin-film transistor, and FIG. 1(*b*) is a cross-sectional view taken along line A–A' of FIG. 1(*a*).

In this thin-film transistor, a strip-shaped gate electrode 3 is formed on an electrically insulating substrate 2, and on this is stacked a semiconductor layer 6 with first and second gate insulating films 4 and 5 sandwiched in between. On both sides of the semiconductor layer 6, a source electrode 8 and a drain electrode 9 are formed with contact layers 7*a* and 7*b* respectively sandwiched in between. The contact layers 7*a* and 7*b* are separated by a gap section 10 located between the source electrode 8 and the drain electrode 9.

Referring to a cross-sectional view of FIG. 2, the following description will discuss a manufacturing method of the above-mentioned thin-film transistor. FIG. 2 shows a cross-sectional view of the thin-film transistor during the formation process of the gap section 10 that is placed between the source electrode 8 and the drain electrode 9.

First, a gate-electrode material, which consequently serves as the gate electrode 3, is stacked on the substrate 2, and a resist pattern having a predetermined shape is formed on this material by a photolithography process. The gate-electrode material is etched by using this pattern so that the gate electrode 3 that is patterned into the predetermined shape is provided. Materials such as glass substrates, quartz and plastic are used as the substrate 2, and materials such as Ta, Al and Cr are used as the gate-electrode material.

Next, the gate electrode 3 is subject to anodic oxidation so that the first gate insulating film 4 is formed. Further, the second gate insulating film 5, a semiconductor-material layer that subsequently serves as the semiconductor layer 6, and a contact-material layer 7 that subsequently serves as the contact layers 7*a* and 7*b* are successively formed through the plasma CVD method. Here, materials such as SiNx and $SiO_2$ are used as the gate insulating film 5, materials such as a-Si (amorphous silicon) and p-Si (poly-silicon) are used as the semiconductor layer 6, and materials such as a-Si (amorphus silicon) with n' and μc-Si (micro-crystal silicon) with n+ are used as the contact layers 7*a* and 7*b*.

Additionally, some constructions do not require the first gate insulating film 4 that is formed by anodic oxidation. Further, the second gate insulating film 5, the semiconductor-material layer and the contact-material layer 7 are not necessarily formed in a successive manner.

Successively, a resist pattern is formed on the contact-material layer 7 by the photolithography process, and the semiconductor-material layer and the contact-material layer 7 are simultaneously patterned by an etching process using the resist pattern. The pattern, formed at this time, does not include a pattern of the gap section 10 located between the source electrode 8 and the drain electrode 9. Therefore, at this time, only the semiconductor layer 6 is formed by the patterning process.

Next, a conductive electrode material, which subsequently serves as the source electrode 8 and the drain electrode 9, is formed, and a resist pattern is formed on the resulting electrode-material layer by the photolithography process. The electrode-material layer is patterned by a wet-etching process using the resist pattern so that the source electrode 8 and the drain electrode 9 are formed. With respect to electrode materials of the source electrode 8 and the drain electrode 9, it is preferable to use ITO (indium tin oxide) and materials containing Al, such as Al, Al/Ti and an Al alloy, that provide a great etch selectivity in respect to the aforementioned contact-material layer 7. In particular, when the materials containing Al are used, it is possible to provide a greater etch selectivity in dry etching. With respect to materials for the electrodes, besides these, Mo, Ta, etc. may be adopted.

Then, after the resist pattern, which was used for the formation of the source electrode 8 and the drain electrode 9, has been removed, the contact-material layer 7 is etched by a dry etching by means of the RIE (Reactive Ion Etching) mode, the plasma etching mode, etc in a plasma etching device, while using the patterned source electrode 8 and drain electrode 9 as masks so that the pattern of the gap section 10 is formed in the contact-material layer 7.

In the dry etching, in the plasma etching mode using the plasma etching device, the etching was carried out with a power of 300 W, under 100 to 1000 mTorr (set at 150 mTorr in this case), while using gases HCl+$SF_6$, each having a flow rate of 350 sccm. In the present embodiment, a glass substrate measuring 370 mm×460 mm was used. At this time, the selectivity of $n^+$ —Si serving as the contact-material layer 7 and the source electrode 8 as well as the drain electrode 9 was not less than 50 (unmeasurable) in the case when ITO and Al metals such as Al and Al/Ti were used as the material of the source electrode 8 and the drain electrode 9. Moreover, the selectivity was 10 to 20 in the case when Mo was used as the material of the source electrode 8 and the drain electrode 9, and the selectivity was 4 to 6 in the case when Ta was used.

Here, not only a single element of $SF_6$ but also HCl flow is used so as to ensure the etch selectivity with respect to the gate insulating film 5 that is an insulating film between the gate electrode 3 and the source electrode 8. In other words, in the case when pin holes exist in the source electrode 8 and the semiconductor layer 6, this method makes it possible to prevent generation of leak due to the material of the gate insulating film 5, such as SiNx and $SiO_2$, being etched, and also to prevent new products from being generated due to the films being unnecessarily etched.

Additionally, even if SiNx, which makes it difficult to ensure a sufficient etch selectivity to a-Si serving as the material for the semiconductor layer 6, is used, it is possible to provide an etch selectivity of not less than 10 as long as the flow rate of HCl with respect to all the etching gases is set at not less than 10%.

Moreover, the application of an etching mode having less ionic properties, such as the plasma etching mode, is less influential to the transistor characteristics, as compared with the application of etching modes having ionic properties, such as the RIE mode. This is particularly effective in the case of TFTs of the channel etching type that do not use an etching protection film on the semiconductor layer 6. Furthermore, the plasma etching mode provides a greater etching selectivity between the contact-material layer 7 and the source electrode 8 as well as the drain electrode 9, as compared with the RIE mode.

Thus, the contact layers 7a and 7b are formed (in FIG. 1(a), the contact layers 7a and 7b are indicated by cross-hatched regions). In this case, n+ —Si was formed as the contact-material layer 7 with a thickness of 50 nm, and a-Si was formed as the semiconductor layer 6 with a thickness of 150 nm, and then, after etching the contact layers 7a and 7b, the semiconductor layer 6 was subject to an over-etching process up to 100 nm. This process is carried out so as to ensure the gap etching of the contact-material layer 7 and to avoid the fact that a sufficient off property can not be obtained unless the interface is caved approximately up to 50 nm due to damages upon film formation and diffusion of phosphorus depending on film-forming conditions.

At this time, the source electrode 8 and the drain electrode 9 are also etched slightly, which results in an increase in resistance. Assuming that the film thickness of the source electrode 8 and the drain electrode 9 is 200 nm, the rate of increase in resistance is 23 to 11% in the case of Ta, which is slightly high, and it is 8 to 4% in the case of Mo. In particular, in the case of ITO and Al metals, the rate of increase in resistance is maintained at not more than 1.5%; thus, no etching virtually occurs. For this reason, it is preferable to keep a high etch selectivity (for example, not less than 4, in particular, not less than 10) . Among those materials, ITO and Al are particularly preferable since they have extremely high etch selectivities, and are hardly etched.

In this manner, the thin-film transistor is manufactured. Additionally, at last, a surface-protective layer, made of SiNx, etc., may be formed.

As described above, in the present embodiment, the patterning process of the gap section 10 is carried out by etching the contact-material layer 7 by the use of the pre-formed source electrode 8 and drain electrode 9 as masks. Therefore, different from conventional constructions, no resist pattern used for etching the gap section is required; thus, it becomes possible to eliminate the photolithography process.

Therefore, it is possible to reduce the production cost. Further, the elimination of the photolithography process reduces inferior patterns that used to be caused by the photolithography process, thereby making it possible to improve the yield of desired products of the thin-film transistors.

Here, in order to use the pre-formed source electrode 8 and the drain electrode 9 as masks, with respect to the electrode material used for forming the source electrode 8 and the drain electrode 9, it is necessary to use a material that has a great etch selectivity in respect to the material for forming the contact-material layer 7. When ITO, Al, Mo, or Ta is used, any of the above-mentioned dry etching process which uses HCl+$SF_6$ gases can provide a sufficiently great etch selectivity between these electrode materials and the material of the contact-material layer 7, thereby eliminating disadvantages that the source electrode 8 and drain electrode 9, used as masks, are simultaneously etched and that new product is generated.

[EMBODIMENT 2]

Figure 3:
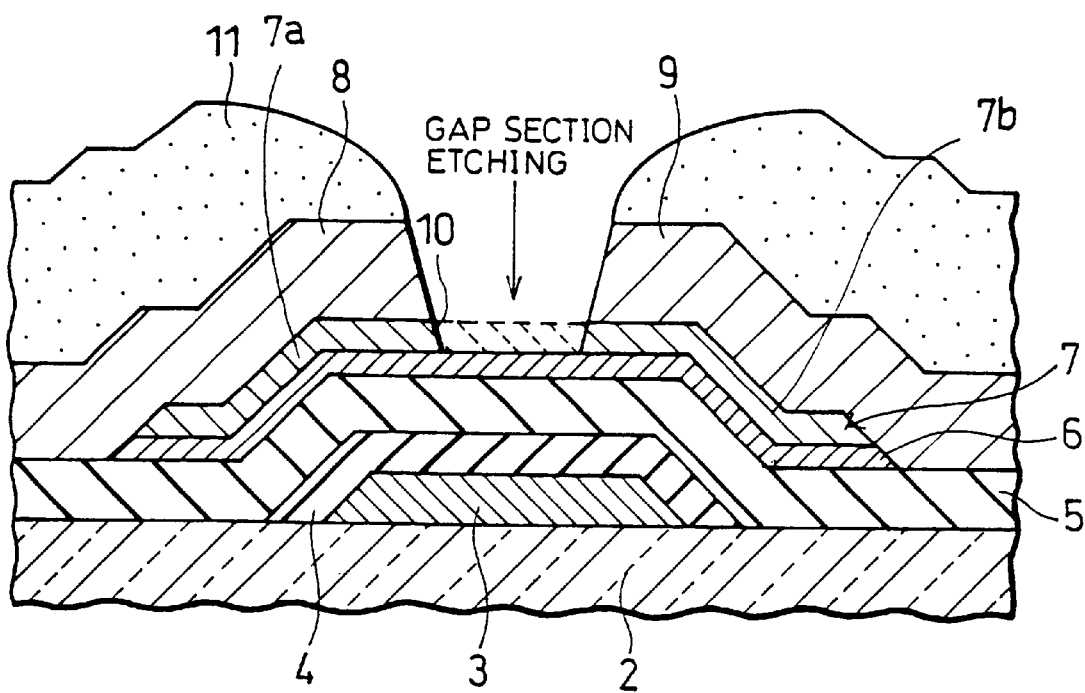
FIG. 3 is a cross-sectional view of the thin-film transistor that clearly shows a processed portion thereof in order to explain manufacturing processes of the thin-film transistor in Embodiments 2 and 3 of the present invention.
Figure 4:
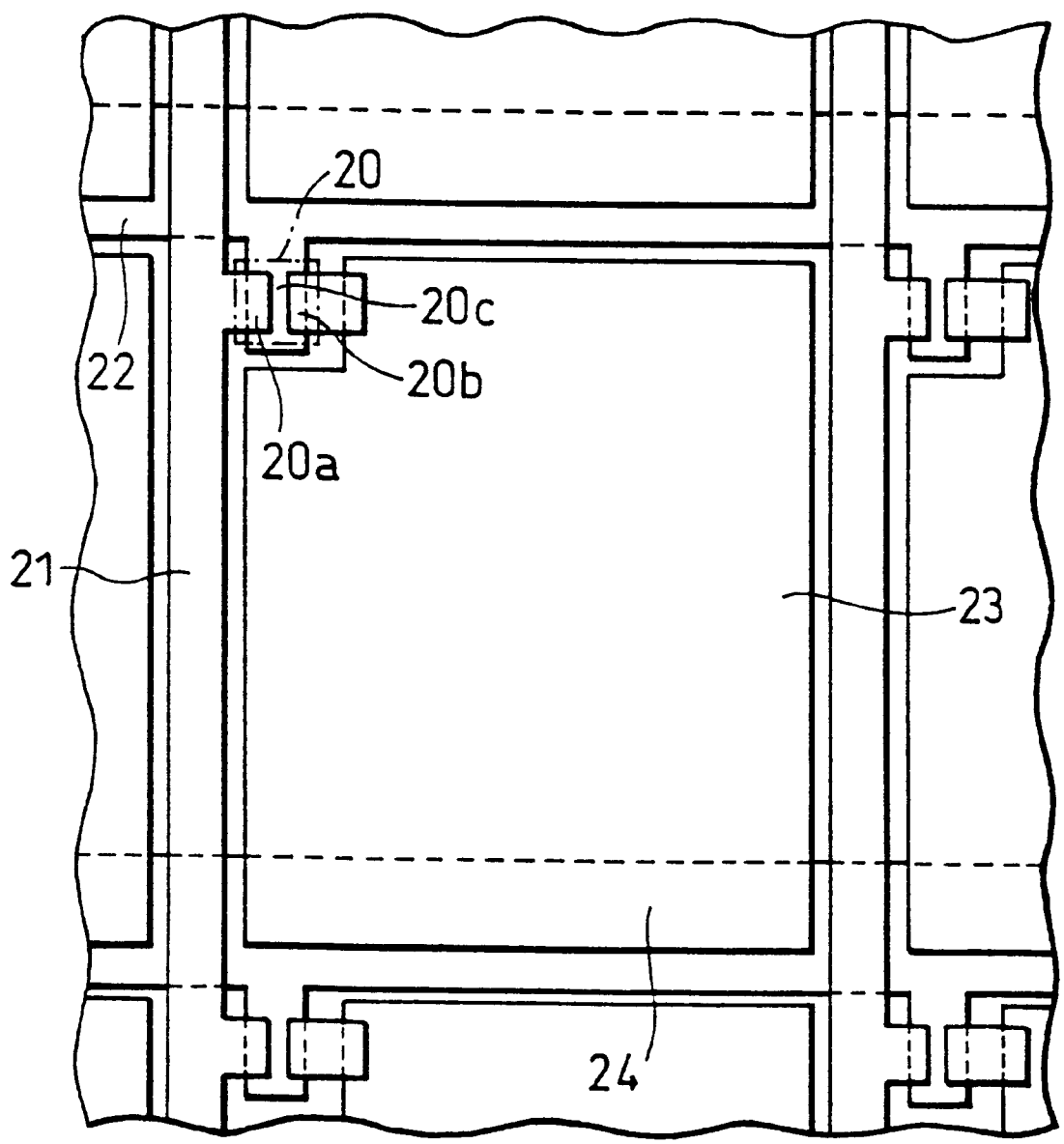
FIG. 4 is a plan view of a TFT liquid crystal display substrate wherein common thin-film transistors are used.
Figure 5A:
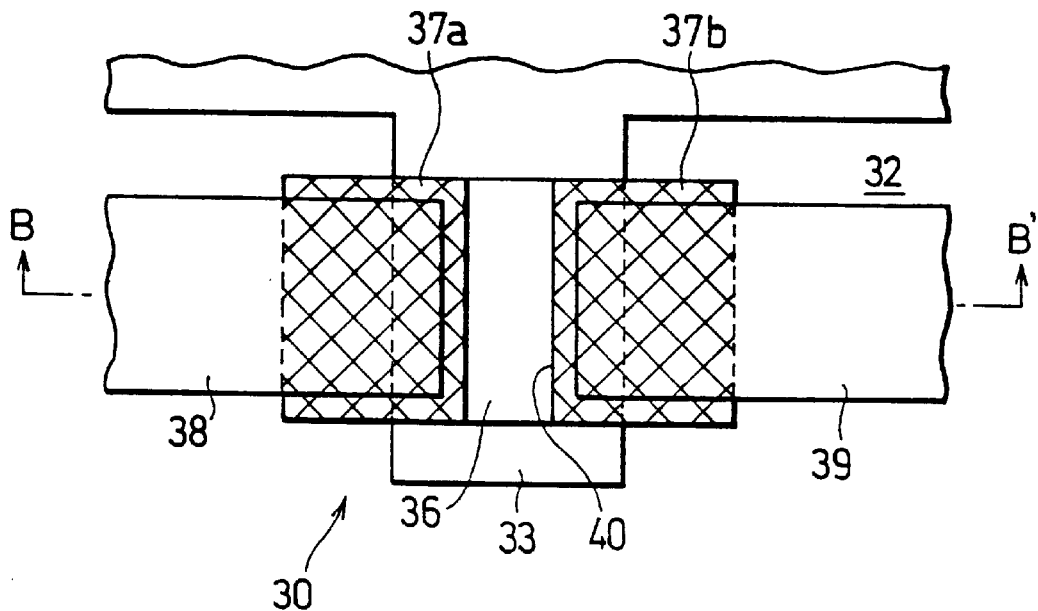
FIG. 5(*a*) is a plan view that shows a construction of a typical thin-film transistor of the prior art.
Figure 5B:
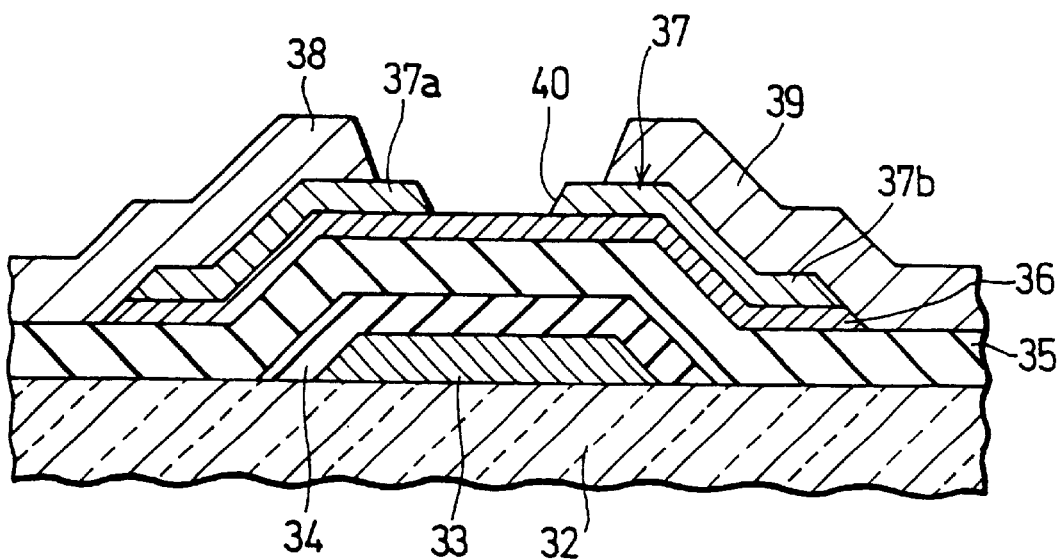

Referring to FIGS. 1 and 3 the following description will discuss another embodiment of the present invention. Here, for convenience of explanation, those members that have the same functions and that are described in the aforementioned Embodiment 1 are indicated by the same reference numbers and the description thereof is omitted.

The construction of the thin-film transistor of the present embodiment is the same as that of the thin-film transistor of Embodiment 1 shown in FIG. 1; therefore, the explanation thereof is omitted, and only the manufacturing method will be explained below with reference to the cross-sectional view of FIG. 3. FIG. 3 shows a cross-sectional view of the thin-film transistor during the formation process of the gap section 10 that is placed between the source electrode 8 and the drain electrode 9.

In this manufacturing method, the same processes as Embodiment 1 are carried out from the formation of the gate electrode 3 on the substrate 2 to the formation of the source electrode 8 and the drain electrode 9 that is carried out by patterning the electrode-material layer 7 through wet etching by the use of the resist pattern 11. With respect to the electrode materials, ITO, Al, Mo and Ta are used in the same manner as Embodiment 1; yet, besides these, Cr, W, Ti, etc. may be used.

Next, although in the aforementioned embodiment 1, the resist pattern 11, which was used for forming the source electrode 8 and the drain electrode 9, is removed, the resist pattern 11 is not removed in this embodiment, and the contact-material layer 7 is etched by using the resist pattern 11, as it is, so that the gap section 10 is patterned. Here, in this case, a plasma etching, which used the plasma etching mode by means of a plasma etching device, was carried out with a power of 300 W under 100 to 1000 mTorr (set at 300 mTorr in this case), while using $CF_4+O_2+HCl$ gases that were respectively set at flow rates of 100, 60 and 100 sccm. In the present embodiment, a glass substrate measuring 370 mm×460 mm was used. In this case, the etch selectivity between $n^+$—Si serving as the contact-material layer 7 and a-Si serving as the semiconductor layer 6 was 3.3. Moreover, under the condition that the flow rate of $CF_4$ was set at 200 sccm with the gas flow rates of the other gases being the same as described above, the etch selectivity was 5.5, and under the condition that only the flow rate of $CF_4$ was set at 300 sccm with the gas flow rates of the other gases being the same as described above, the etch selectivity was 5.1. Thereafter, the same processes as Embodiment 1 were carried out.

Normally, it is not possible to provide a sufficient etch selectivity between the contact-material layer 7 and the semiconductor layer 6; however, by using $CF_4+O_2+HCl$ as etching gases as described above, it becomes possible to provide a sufficient etch selectivity. Thus, even in the case of channel-etching type TFTs, the film thickness of the semiconductor layer 6 can be reduced so that it becomes possible to obtain TFTs having superior characteristics such as the capability of suppressing light leak. Moreover, it is possible to reduce generation of carbon dioxide. For example, as compared with $SF_6$, the greenhouse gas coefficient (relative coefficient on the assumption that $CO_2$ is 1) can be reduced to ¼, which is effective in terms of environmental protection.

Moreover, the patterning process of the gap section 10 is carried out by etching the contact-material layer 7 by the use of the resist pattern 11, as it is, used for the pre-formed source electrode 8 and drain electrode 9. Therefore, in the same manner as Embodiment 1, no resist pattern which is to be used for etching the gap section is required; thus, it is possible to eliminate the photolithography process. As a result, it becomes possible to reduce the production cost, and the elimination of the photolithography process reduces inferior patterns that used to be caused by the photolithography process, thereby making it possible to improve the yield of desired products of the thin-film transistors.

Moreover, the present embodiment does not directly use the source electrode 8 and the drain electrode 9 as masks during the etching process, resulting in another advantage in that it becomes possible to expand the scope of selectivity of etching conditions and of electrode materials used for the source electrode 8 and the drain electrode 9, as compared with the method of Embodiment 1.

[EMBODIMENT 3]

Referring to FIGS. 1 and 3 the following description will discuss another embodiment of the present invention. Here, for convenience of explanation, those members that have the same functions and that are described in the aforementioned Embodiments 1 and 2 are indicated by the same reference numbers and the description thereof is omitted.

The construction of the thin-film transistor of the present embodiment is the same as that of the thin-film transistor of Embodiment 1 shown in FIG. 1; therefore, the explanation thereof is omitted, and only the manufacturing method will be explained below with reference to the cross-sectional view of FIG. 3.

In this manufacturing method, the same processes as Embodiment 1 are carried out from the formation of the gate electrode 3 on the substrate 2 to the formation of the electrode material layer. However, in the manufacturing method of the present embodiment, the source electrode 8 and the drain electrode 9 are formed by patterning the electrode-material layer through a dry etching process using the resist pattern 11 in a vacuum chamber. Here, materials, such as Ta, ITO, Al, Cr and Mo, are preferably used as the electrode materials of the source electrode 8 and the drain electrode 9.

Next, in order to pattern the gap section 10, the contact-material layer 7 is successively dry-etched in the same vacuum chamber by using the resist pattern 11, as it is, that was used for forming the source electrode 8 and the drain electrode 9. With respect to gases used in this dry etching process, $HCl+SF_6$ gases or $CF_4+O_2+HCl$ gases are used in the same manner as Embodiment 1 or Embodiment 2. Thereafter, the same processes as Embodiment 1 are carried out.

In this way, the gap section 10 is formed by etching the contact-material layer 7 by the use of the resist pattern 11, as it is, used for the pre-formed source electrode 8 and drain electrode 9; thus, it is possible to obtain the same effects as the aforementioned Embodiment 2. Moreover, since the patterning process of the source electrode 8 and the drain electrode 9 and the patterning process of the gap section 10 in the contact-material layer 7 are continuously carried out in the same chamber without being exposed to the air, these processes are maintained in a vacuum state. Therefore, it becomes possible to avoid adhesion of foreign matters to the processed objects, and consequently to improve the yield of desired products. Moreover, since not only time loss caused by adjustments of the pressure difference between atmosphere and vacuum, but also time loss caused by transportation of the processed objects among devices during the respective processes, is minimized greatly as compared with conventional methods, this method is very effective from the standpoint of throughput.

Furthermore, instead of using the same chamber, another chamber may be provided that allows transportation of the processed objects in a vacuum state, and the dry etching processes may be continuously carried out between these chambers; this method also provides the same effects as described above.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A manufacturing method of thin-film transistors comprising:
   a first step of forming a gate electrode on an electrically insulating substrate;
   a second step of forming a gate insulating film and a semiconductor layer on the gate electrode;
   a third step of forming a single contact-material layer on the semiconductor layer;
   a fourth step of forming an electrode-material layer by forming a conductive electrode material on the contact-material layer, as well as forming a source electrode and a drain electrode by patterning the electrode-material layer; and
   a fifth step of patterning a gap section that divides the contact-material layer into the source-electrode side and the drain-electrode side by a plasma etching with etching gases including HCl and $SF_6$ using the source electrode and the drain electrode as masks so that a plurality of conductive contact layers are formed, in order to obtain a construction wherein the source electrode is connected to one side of the contact layer and the drain electrode is connected to the other side of the contact layer.

2. The manufacturing method of thin-film transistors as defined in claim 1, wherein, at said fourth step, a material selected from the group consisting of indium-tin oxide, aluminum, molybdenum and tantalum is used as a material for the electrodes.

3. A manufacturing method of thin-film transistors comprising:
   a first step of forming a gate electrode on an electrically insulating substrate;
   a second step of forming a gate insulating film and a semiconductor layer on the gate electrode;
   a third step of forming a single contact-material layer on the semiconductor layer;
   a fourth step of forming an electrode-material layer by forming a conductive electrode material on the contact-material layer, as well as forming a source electrode and a drain electrode by patterning the electrode-material layer using a photoresist pattern; and
   a fifth step of patterning a gap section that divides the contact-material layer into the source-electrode side and the drain-electrode side by a plasma etching with etching gases including HCl and $CF_4$ using the source electrode and the drain electrode as masks or using the photoresist pattern that has been used for patterning the source electrode and the drain electrodes so that a plurality of conductive contact layers are formed, in order to obtain a construction wherein the source electrode is connected to one side of the contact layer and the drain electrode is connected to the other side of the contact layer.

4. The manufacturing method of thin-film transistors as defined in claim 3, wherein, at said fourth step, a material selected from the group consisting of indium-tin oxide, aluminum, molybdenum and tantalum is used as a material for the electrodes.

* * * * *